(12) United States Patent
Song

(10) Patent No.: US 9,331,839 B2
(45) Date of Patent: May 3, 2016

(54) RECEIVERS AND SEMICONDUCTOR SYSTEMS INCLUDING THE SAME

(71) Applicant: SK hynix Inc., Icheon-si Gyeonggi-do (KR)

(72) Inventor: Keun Soo Song, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/946,945

(22) Filed: Nov. 20, 2015

(65) Prior Publication Data

US 2016/0080139 A1    Mar. 17, 2016

Related U.S. Application Data

(62) Division of application No. 14/083,725, filed on Nov. 19, 2013, now Pat. No. 9,225,505.

(30) Foreign Application Priority Data

Jun. 17, 2013    (KR) .................. 10-2013-0069281

(51) Int. Cl.
*H04L 7/00* (2006.01)
(52) U.S. Cl.
CPC ............ *H04L 7/0037* (2013.01); *H04L 7/0079* (2013.01)

(58) Field of Classification Search
CPC ....... H04L 7/00; H04L 7/0008; H04L 7/0016; H04L 7/0033; H04L 7/0037; H04L 7/0045; H04L 7/005; H04L 7/0079; H04L 7/0087
USPC ......... 375/316, 295, 219, 222, 220, 354, 355, 375/371, 372
See application file for complete search history.

(56) References Cited

U.S. PATENT DOCUMENTS

| | | | | |
|---|---|---|---|---|
| 7,940,072 B2* | 5/2011 | Suda | ................ | G01R 31/31922 324/762.01 |
| 2005/0111602 A1* | 5/2005 | Suda | ................ | G01R 31/31922 375/355 |
| 2014/0070864 A1* | 3/2014 | Kossel | ............ | H03K 19/00361 327/271 |

* cited by examiner

*Primary Examiner* — Siu Lee
(74) *Attorney, Agent, or Firm* — William Park & Associates Ltd.

(57) ABSTRACT

The receiver includes a first buffer configured to buffer a data to generate a first internal data, a first delay unit configured to retard the first internal clock signal by a first delay period to generate a first delayed internal clock signal, and a second buffer configured to buffer the first internal data to generate a first input data.

9 Claims, 6 Drawing Sheets

222

RECEIVERS AND SEMICONDUCTOR SYSTEMS INCLUDING THE SAME

CROSS-REFERENCE TO RELATED APPLICATION

The present application is a Division of U.S. application Ser. No. 14/083,725, filed on Nov. 19, 2013, and the present application claims priority under 35 U.S.C 119(a) to Korean Application No. 10-2013-0069281, filed on Jun. 17, 2013, in the Korean Intellectual Property Office, which is incorporated herein by reference in its entirety as set forth in full.

BACKGROUND

1. Technical Field

Embodiments relate to semiconductor systems and, more particularly, receivers and semiconductor systems including the same.

2. Related Art

Fast semiconductor systems are increasingly in demand with the improvement of their integration density. Synchronous devices operating in synchronization with external clock signals have been revealed to improve the operation speed thereof.

At first, single data rate (SDR) synchronous semiconductor devices have been proposed to improve the operation speed thereof. The SDR synchronous semiconductor devices may receive or output a single data through a single data pin for one cycle time of the external clock signal in synchronization with every rising edge of the external clock signal.

However, high performance devices operating at a higher speed than the SDR synchronous semiconductor devices have been demanded to meet the requirements of high performance semiconductor systems. Accordingly, double data rate (DDR) synchronous semiconductor devices have been proposed recently. The DDR synchronous semiconductor devices may receive or output the data in synchronization with every rising edge and every falling edge of the external clock signal. Thus, the DDR synchronous semiconductor devices may operate at a speed which is at least twice higher than that of the SDR synchronous semiconductor devices even without increase of a frequency of the external clock signal.

SUMMARY

Various embodiments are directed to receivers and semiconductor systems including the same.

According to various embodiments, a semiconductor system includes a transmitter and a receiver. The transmitter generates a data strobe signal and a data. The receiver generates an internal clock signal and retards the internal clock signal to generate a delayed internal clock signal. Further, the receiver buffers the data to generate an input data.

According to various embodiments, a receiver includes a first buffer configured to buffer a data to generate a first internal data, a first delay unit configured to retard the first internal clock signal by a first delay period to generate a first delayed internal clock signal, and a second buffer configured to buffer the first internal data to generate a first input data.

According to various embodiments, a semiconductor system includes a transmitter and a receiver. The transmitter configured to generate a first internal clock signal, a second internal clock signal, and a data. The receiver retards the first and second internal clock signals to generate a first delayed internal clock signal and a second delayed internal clock signal. Further, the receiver buffers the data. Moreover, the receiver buffers the buffered data to generate a first input data and a second input data.

According to an embodiment, a receiver comprises: a first buffer configured to amplify a data to output the data as a first internal data; a first delay unit configured to include an inverter chain to retard a first internal clock signal; and a second buffer configured to buffer the first internal data to generate a first input data.

BRIEF DESCRIPTION OF THE DRAWINGS

Embodiments of the present invention will become more apparent in view of the attached drawings and accompanying detailed description, in which.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
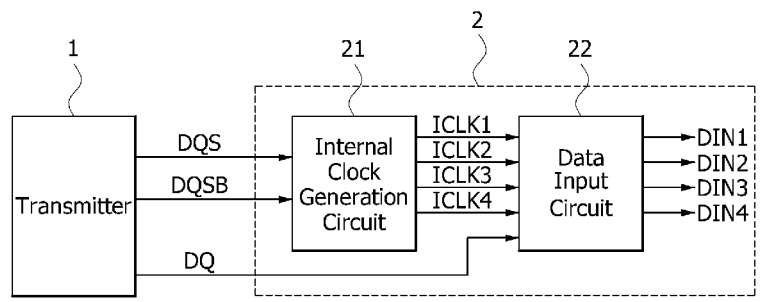
FIG. 1 is a block diagram illustrating a semiconductor system according to various embodiments of the present invention.

Referring to FIG. 1, a semiconductor system according to an embodiment of the present invention may include a transmitter 1 and a receiver 2. The transmitter 1 may generate data strobe signals DQS and DQSB and a data DQ. The receiver 2 may include an internal clock generation circuit 21 and a data input circuit 22. The internal clock generation circuit 21 may divide the data strobe signals DQS and DQSB to generate a first internal clock signal ICLK1, a second internal clock signal ICLK2, a third internal clock signal ICLK3 and a fourth internal clock signal ICLK4. The internal clock generation circuit 21 may be a frequency divider that increases cycle times of input clock signals by "N" to generate output clock signals. That is, the internal clock generation circuit 21 may receive the input clock signals to output the output clock signals having a cycle time which is equal to "N" multiplied by that of the input clock signals. Here, "N" may denote a natural number. In an embodiment, the first internal clock signal ICLK1 may precede the second internal clock signal ICLK2 by a phase of about 90 degrees, and the second internal clock signal ICLK2 may precede the third internal clock signal ICLK3 by a phase of about 90 degrees. Further, the third internal clock signal ICLK3 may precede the fourth internal clock signal ICLK4 by a phase of about 90 degrees. The phases of the first, second, third and fourth internal clock signals ICLK1, ICLK2, ICLK3 and ICLK4 may be set to be different according to embodiments. The data input circuit 22 may buffer the data DQ in response to the first, second, third and fourth internal clock signals ICLK1, ICLK2, ICLK3 and ICLK4 to generate a first input data DIN1, a second input data DIN2, a third input data DIN3 and a fourth input data DIN4.

Figure 2:
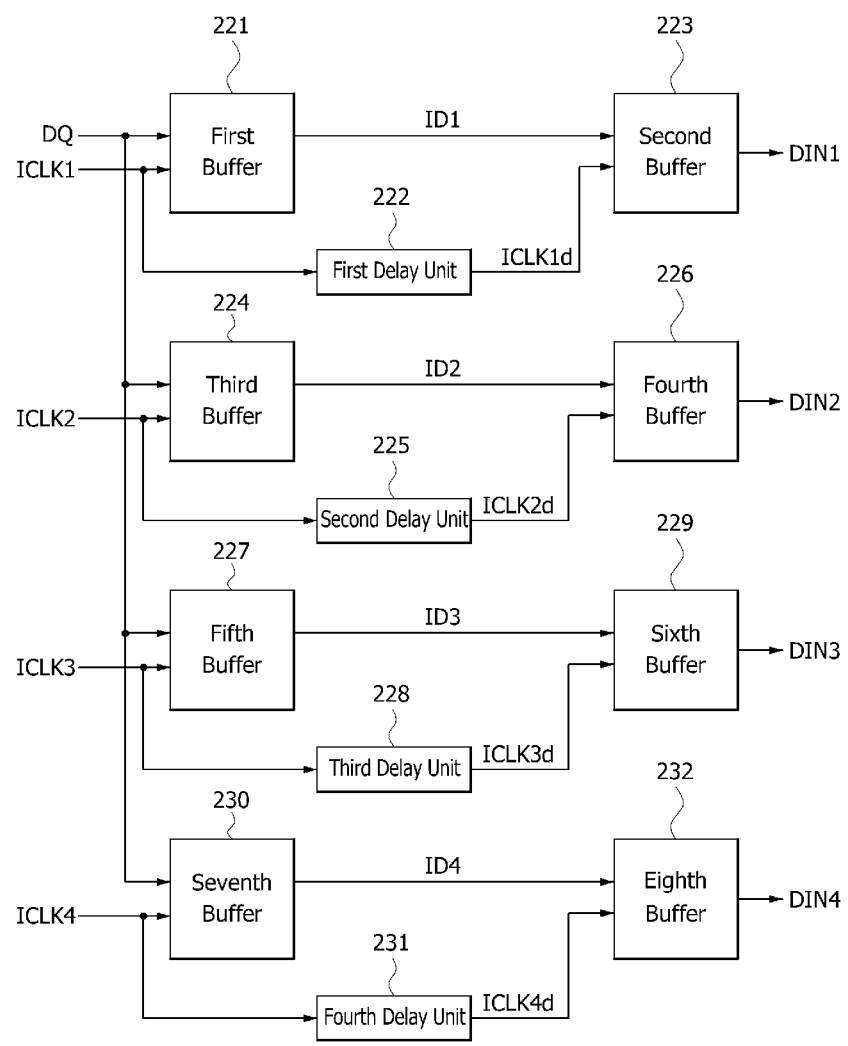
FIG. 2 is a block diagram illustrating a data input circuit included in the semiconductor system of FIG. 1.

Referring to FIG. 2, the data input circuit 22 may include a first buffer 221, a first delay unit 222, a second buffer 223, a third buffer 224, a second delay unit 225, a fourth buffer 226, a fifth buffer 227, a third delay unit 228, a sixth buffer 229, a seventh buffer 230, a fourth delay unit 231, and an eighth buffer 232.

The first buffer 221 may buffer the data DQ in synchronization with the first internal clock signal ICLK1 to generate a first internal data ID1. The first buffer 221 may operate at a predetermined state, for example, at a rising edge and a logic "high" level of the first internal clock signal ICLK1. What the first buffer 221 buffers the data DQ may mean driving the data DQ with a power voltage supplied to the first buffer 221. Thus, the first buffer 221 may execute an operation that amplifies the data DQ to output the amplified data as the first internal data ID1. The first delay unit 222 may retard the first internal clock signal ICLK1 to generate a first delayed internal clock signal ICLK1d. The first delay unit 222 may be configured to include a passive element such as an inverter chain to retard the first internal clock signal ICLK1 regardless of the first to fourth internal clock signals ICLK1, ICLK2, ICLK3 and ICLK4. The second buffer 223 may buffer the first internal data ID1 in synchronization with the first delayed internal clock signal ICLK1d to generate the first input data DIN1.

The third buffer 224 may buffer the data DQ in synchronization with the second internal clock signal ICLK2 to generate a second internal data ID2. The second delay unit 225 may retard the second internal clock signal ICLK2 to generate a second delayed internal clock signal ICLK2d. The second delay unit 225 may be configured to include a passive element such as an inverter chain to retard the second internal clock signal ICLK2 regardless of the first to fourth internal clock signals ICLK1, ICLK2, ICLK3 and ICLK4. The fourth buffer 226 may buffer the second internal data ID2 in synchronization with the second delayed internal clock signal ICLK2d to generate the second input data DIN2.

The fifth buffer 227 may buffer the data DQ in synchronization with the third internal clock signal ICLK3 to generate a third internal data ID3. The third delay unit 228 may retard the third internal clock signal ICLK3 to generate a third delayed internal clock signal ICLK3d. The third delay unit 228 may be configured to include a passive element such as an inverter chain to retard the third internal clock signal ICLK3 regardless of the first to fourth internal clock signals ICLK1, ICLK2, ICLK3 and ICLK4. The sixth buffer 229 may buffer the third internal data ID3 in synchronization with the third delayed internal clock signal ICLK3d to generate the third input data DIN3.

The seventh buffer 230 may buffer the data DQ in synchronization with the fourth internal clock signal ICLK3 to generate a fourth internal data ID4. The fourth delay unit 231 may retard the fourth internal clock signal ICLK4 to generate a fourth delayed internal clock signal ICLK4d. The fourth delay unit 231 may be configured to include a passive element such as an inverter chain to retard the fourth internal clock signal ICLK4 regardless of the first to fourth internal clock signals ICLK1, ICLK2, ICLK3 and ICLK4. The eighth buffer 232 may buffer the fourth internal data ID4 in synchronization with the fourth delayed internal clock signal ICLK4d to generate the fourth input data DIN4.

Figure 3:
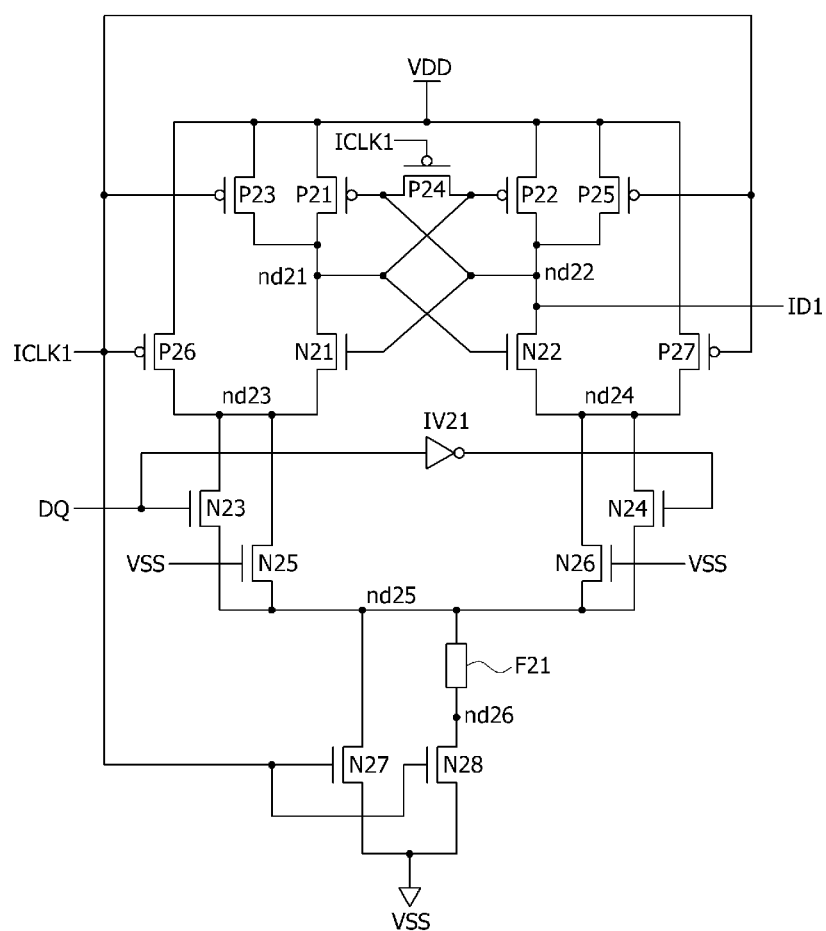
FIG. 3 is a circuit diagram illustrating a first buffer included in the data input circuit of FIG. 2.

Referring to FIG. 3, the first buffer 221 may be configured to include a cross coupled latch circuit that buffers the data DQ to output the buffered data as the first internal data ID1 when the first internal clock signal ICLK1 has a logic "high" level. The first buffer 221 may include a plurality of PMOS transistors P21~P27, a fuse F21, and a plurality NMOS transistors N21~N28.

The PMOS transistor P21 may be coupled between a power voltage VDD terminal and a node ND21 and may be turned on in response to a voltage level of a node ND22. The PMOS transistor P22 may be coupled between the power voltage VDD terminal and the node ND22 and may be turned on in response to a voltage level of the node ND21. The PMOS transistor P23 may be coupled between the power voltage VDD terminal and the node ND21 and may be turned on in response to the first internal clock signal ICLK1. The PMOS transistor P24 may be coupled between the node ND21 and the node ND22 and may be turned on in response to the first internal clock signal ICLK1. The PMOS transistor P25 may be coupled between the power voltage VDD terminal and the node ND22 and may be turned on in response to the first internal clock signal ICLK1. The PMOS transistor P26 may be coupled between the power voltage VDD terminal and a node ND23 and may be turned on in response to the first internal clock signal ICLK1. The PMOS transistor P27 may be coupled between the power voltage VDD terminal and a node ND24 and may be turned on in response to the first internal clock signal ICLK1.

The NMOS transistor N21 may be coupled between the node ND21 and the node ND23 and may be turned on in response to a voltage level of the node ND22. The NMOS transistor N22 may be coupled between the node ND22 and the node ND24 and may be turned on in response to a voltage level of the node ND21. The NMOS transistor N23 may be coupled between the node ND23 and a node ND25 and may be turned on in response to a voltage level of the data DQ. An inverter IV21 may inversely buffer the data DQ to output the inversed and buffered data. The NMOS transistor N24 may be coupled between the node ND24 and the node ND25 and may be turned on in response to an output signal of the inverter IV21. The NMOS transistor N25 may be coupled between the node ND23 and the node ND25 and may be driven in response to a ground voltage VSS. The NMOS transistor N26 may be coupled between the node ND24 and the node ND25 and may be driven in response to the ground voltage VSS. The NMOS transistors N25 and N26 may be preliminary dummy elements which are capable of receiving a predetermined signal instead of the ground voltage VSS when it is necessary to amplify the predetermined signal other than the data DQ. The NMOS transistor N27 may be coupled between the node ND25 and a ground voltage VSS terminal and may be turned on in response to the first internal clock signal ICLK1. The fuse F21 may be coupled between the node ND25 and a node ND26. The fuse F21 may control a pull-down drivability of the first buffer 221 when the first buffer 221 are driven with the first internal clock signal ICLK1 having a logic "high" level. That is, when the fuse F21 is not cut, the NMOS transistor N28 coupled between the node ND26 and the ground voltage VSS terminal may also operate to increase a pull-down drivability of the first buffer 221 as compared to a case that the fuse F21 is cut. The NMOS transistor N28 may be turned on in response to the first internal clock signal ICLK1.

When the first internal clock signal ICLK1 has a logic "low" level, the PMOS transistors P23, P24, P25, P26 and P27 may be turned on and the NMOS transistors N27 and N28 may be turned off. Thus, the first buffer 221 may terminate a buffering operation thereof without any leakage current. In contrast, when the first internal clock signal ICLK1 has a logic "high" level, the PMOS transistors P23, P24, P25, P26 and P27 may be turned off and the NMOS transistors N27 and N28 may be turned on. Thus, the first buffer 221 may buffer the data DQ to generate the first internal data ID1. When the data DQ has a logic "high" level, a voltage level of the node ND23 may be relatively lower than that of the node ND24. Thus, the NMOS transistor N21 may be turned on more than the NMOS transistor N22. Accordingly, a voltage level of the node ND21 may become relatively lower than that of the node ND22, and the PMOS transistor P21 may be turned on less than the PMOS transistor P22. As a result, a voltage level of the node ND21 may be continuously lowered to have a logic "low" level, and a level of the node ND22 may be continuously heightened to have a logic "high" level. Each of the second, third, fourth, fifth, sixth, seventh and eighth buffers 223, 224, 226, 227, 229, 230 and 232 may have substantially the same configuration as the first buffer 221 except its input and output signals. Thus, detailed descriptions of the second, third, fourth, fifth, sixth, seventh and eighth buffers 223, 224, 226, 227, 229, 230 and 232 will be omitted hereinafter.

Figure 4:
FIG. 4 is a circuit diagram illustrating a first delay unit included in the data input circuit of FIG. 2.
Figure 5:
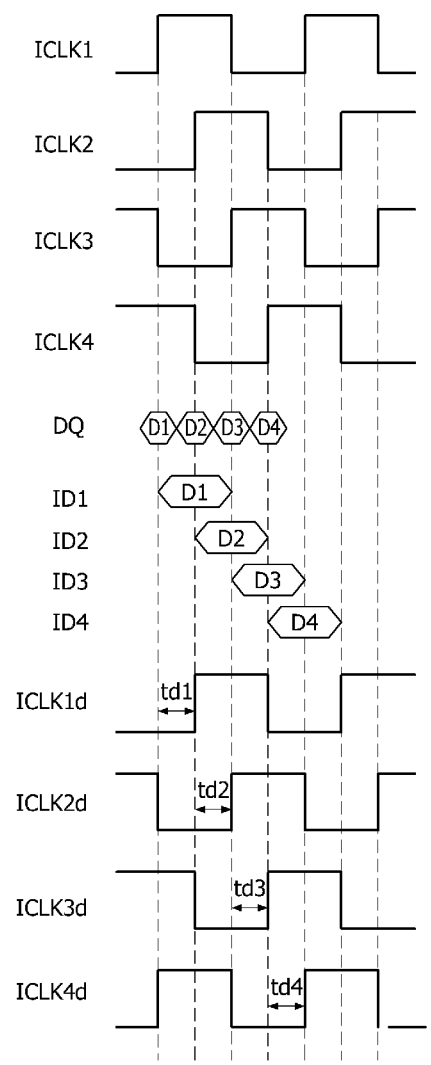
FIG. 5 is a timing diagram illustrating an operation of the semiconductor system shown in FIG. 1.

Referring to FIG. 4, the first delay unit 222 may be realized using an inverter chain. The inverter chain may include a plurality of passive elements, for example, a plurality of inverters that asynchronously operate. Thus, the first delay unit 222 may retard the first internal clock signal ICLK1 regardless of the first to fourth internal clock signals ICLK1, ICLK2, ICLK3 and ICLK4 to generate the first delayed internal clock signal ICLK1$d$. Each of the second, third and fourth delay units 225, 228 and 231 may have substantially the same configuration as the first delay unit 222 except its input and output signals. Thus, detailed descriptions of the second, third and fourth delay units 225, 228 and 231 will be omitted hereinafter.

An operation of the semiconductor system set forth above will be described more fully hereinafter with reference to FIGS. 1, 2, 3, 4 and 5.

First, the receiver 2 may divide the data strobe signals DQS and DQSB supplied from the transmitter 1 to generate the first, second, third and fourth internal clock signals ICLK1, ICLK2, ICLK3 and ICLK4. The first internal clock signal ICLK1 may be generated to precede the second internal clock signal ICLK2 by a phase of about 90 degrees, and the second internal clock signal ICLK2 may be generated to precede the third internal clock signal ICLK3 by a phase of about 90 degrees. Further, the third internal clock signal ICLK3 may be generated to precede the fourth internal clock signal ICLK4 by a phase of about 90 degrees.

Next, the data input circuit 22 may buffer the data DQ in synchronization with the first, second, third and fourth internal clock signals ICLK1, ICLK2, ICLK3 and ICLK4 to generate the first, second, third and fourth internal data ID1, ID2, ID3 and ID4. The first, second, third and fourth internal data ID1, ID2, ID3 and ID4 may be generated in synchronization with the first, second, third and fourth internal clock signals ICLK1, ICLK2, ICLK3 and ICLK4, respectively. Thus, a first data D1, a second data D2, a third data D3 and a fourth data D4 included in the data DQ may be sequentially outputted as the first, second, third and fourth internal data ID1, ID2, ID3 and ID4.

Subsequently, the data input circuit 22 may buffer the first, second, third and fourth internal data ID1, ID2, ID3 and ID4 in synchronization with the first, second, third and fourth delayed internal clock signals ICLK1$d$, ICLK2$d$, ICLK3$d$ and ICLK4$d$ to output the first, second, third and fourth buffered internal data as the first, second, third and fourth input data DIN1, DIN2, DIN3 and DIN4, respectively. The first, second, third and fourth delayed internal clock signals ICLK1$d$, ICLK2$d$, ICLK3$d$ and ICLK4$d$ may be respectively generated from the first, second, third and fourth delay units 222, 225, 228 and 231, each of which is configured to include passive elements operating regardless of the first, second, third and fourth internal clock signals ICLK1, ICLK2, ICLK3 and ICLK4. Thus, a first delay period TD1 by which the first internal clock signal ICLK1 is delayed to generate the first delayed internal clock signal ICLK1$d$ may be set regardless of the first, second, third and fourth internal clock signals ICLK1, ICLK2, ICLK3 and ICLK4, and a second delay period TD2 by which the second internal clock signal ICLK2 is delayed to generate the second delayed internal clock signal ICLK2$d$ may also be set regardless of the first, second, third and fourth internal clock signals ICLK1, ICLK2, ICLK3 and ICLK4. Similarly, a third delay period TD3 by which the third internal clock signal ICLK3 is delayed to generate the third delayed internal clock signal ICLK3$d$ may be set regardless of the first, second, third and fourth internal clock signals ICLK1, ICLK2, ICLK3 and ICLK4, and a fourth delay period TD4 by which the fourth internal clock signal ICLK4 is delayed to generate the fourth delayed internal clock signal ICLK4$d$ may also be set regardless of the first, second, third and fourth internal clock signals ICLK1, ICLK2, ICLK3 and ICLK4. The first delay period TD1 may be set such that a rising edge of the first delayed internal clock signal ICLK1$d$ is located at a central point of a data window of the first internal data ID1, and the second delay period TD2 may be set such that a rising edge of the second delayed internal clock signal ICLK2$d$ is located at a central point of a data window of the second internal data ID2. Similarly, the third delay period TD3 may be set such that a rising edge of the third delayed internal clock signal ICLK3$d$ is located at a central point of a data window of the third internal data ID3, and the fourth delay period TD4 may be set such that a rising edge of the fourth delayed internal clock signal ICLK4$d$ is located at a central point of a data window of the fourth internal data ID4. In such a case, it may prevent the first, second, third and fourth internal data ID1, ID2, ID3 and ID4 from being re-buffered before the first, second, third and fourth internal data ID1, ID2, ID3 and ID4 are driven to have stable levels.

As described above, the semiconductor system according to embodiments may control the first to fourth delay periods TD1~TD4 determined by passive elements to prevent a malfunction thereof when the data DQ are amplified through a couple of steps even though the cycle times of the first to fourth internal clock signals ICLK1~ICLK4 are reduced because of a high operation speed. That is, because points of time that the data DQ is amplified are set regardless of the first to fourth internal clock signals ICLK1~ICLK4, the semiconductor system may stably receive the data DQ even at a high operation speed.

Figure 6:
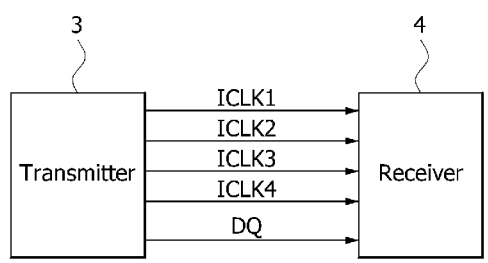
FIG. 6 is a block diagram illustrating another semiconductor system according to various embodiments of the present invention.

Referring to FIG. 6, a semiconductor system according to an embodiment may include a transmitter 3 and a receiver 4. The transmitter 3 may apply a first internal clock signal ICLK1, a second internal clock signal ICLK2, a third internal clock signal ICLK3, a fourth internal clock signal ICLK4 and a data DQ to the receiver 4. In an embodiment, the first internal clock signal ICLK1 may precede the second internal clock signal ICLK2 by a phase of about 90 degrees, and the second internal clock signal ICLK2 may precede the third internal clock signal ICLK3 by a phase of about 90 degrees. Further, the third internal clock signal ICLK3 may precede the fourth internal clock signal ICLK4 by a phase of about 90 degrees. The receiver 4 may receive the data DQ in synchronization with the first, second, third and fourth internal clock signals ICLK1, ICLK2, ICLK3 and ICLK4. The semiconductor system according to an embodiment may not generate the first to fourth internal clock signals ICLK1~ICLK4 by dividing data strobe signals (DQS and DQSB of FIG. 1) in the receiver 4 but directly receives the first to fourth internal clock signals ICLK1~ICLK4 outputted from the transmitter 3.

The receiver 4 may be realized to have the same configuration as the data input circuit 22 illustrated in FIG. 2. That is, the receiver 4 may retard the first to fourth internal clock signals ICLK1~ICLK4 with delay units realized using passive elements such as inverter chains to generate first to fourth delayed internal clock signals ICLK1d~ICLK4d. Further, the receiver 4 may buffer the data DQ in synchronization with the first to fourth internal clock signals ICLK1~ICLK4 to generate first to fourth internal data ID1~ID4 and may then buffer the first to fourth internal data ID1~ID4 in synchronization with the first to fourth delayed internal clock signals ICLK1d~ICLK4d.

What is claimed is:

1. A semiconductor system comprising:
   a transmitter configured to generate a first internal clock signal, a second internal clock signal, and a data; and
   a receiver configured to retard the first and second internal clock signals to generate a first delayed internal clock signal and a second delayed internal clock signal, configured to buffer the data in synchronization with the first and second internal clock signals, and configured to buffer the buffered data in synchronization with the first and second delayed internal clock signals to generate a first input data and a second input data.

2. The semiconductor system of claim 1, wherein the first internal clock signal precedes the second internal clock signal by a phase of 90 degrees.

3. The semiconductor system of claim 1, wherein the first internal clock signal and the second internal clock signal are generated by dividing a data strobe signal.

4. The semiconductor system of claim 3, wherein the first internal clock signal has a cycle time which is equal to "N" multiplied by that of the data strobe signal, and "N" denote a natural number larger than "1".

5. The semiconductor system of claim 3, wherein the second internal clock signal has a cycle time which is equal to "N" multiplied by that of the data strobe signal, and "N" denote a natural number larger than "1".

6. The semiconductor system of claim 1, wherein the receiver includes:
   a first buffer configured to buffer the data in synchronization with the first internal clock signal to generate a first internal data;
   a first delay unit configured to retard the first internal clock signal by a first delay period to generate the first delayed internal clock signal; and
   a second buffer configured to buffer the first internal data in synchronization with the first delayed internal clock signal to generate the first input data.

7. The semiconductor system of claim 6, further comprising:
   a third buffer configured to buffer the data in synchronization with the second internal clock signal to generate a second internal data;
   a second delay unit configured to retard the second internal clock signal by a second delay period to generate the second delayed internal clock signal; and
   a fourth buffer configured to buffer the second internal data in synchronization with the second delayed internal clock signal to generate the second input data.

8. The semiconductor system of claim 7, wherein each of the first, second, third and fourth buffers is a cross coupled latch circuit.

9. The semiconductor system of claim 7, wherein each of the first and second delay units is an inverter chain.

* * * * *